(12) United States Patent
Elliott (10) Patent No.: US 10,411,719 B1
(45) Date of Patent: Sep. 10, 2019

(54) DIRECT MEASUREMENT DELAY CALIBRATION METHOD AND APPARATUS

(71) Applicant: Western Digital Technologies, Inc., San Jose, CA (US)

(72) Inventor: Mark S. Elliott, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/051,374

(22) Filed: Jul. 31, 2018

Related U.S. Application Data (60) Provisional application No. 62/681,018, filed on Jun. 5, 2018.

(51) Int. Cl.
  *H03L 7/099* (2006.01)
  *H03K 5/00* (2006.01)

(52) U.S. Cl.
  CPC .......... *H03L 7/0992* (2013.01); *H03L 7/0995* (2013.01); *H03K 2005/00058* (2013.01)

(58) Field of Classification Search
  CPC ..... H03L 7/099; H03L 7/0995; H03L 7/0992; H03L 7/089; H03L 7/091; H03L 7/08
  USPC ........................................ 327/156, 158, 161
  See application file for complete search history.

(56) References Cited

U.S. PATENT DOCUMENTS

| | | | |
|---|---|---|---|
| 6,421,784 B1 | 7/2002 | Chu et al. | |
| 6,687,321 B1 | 2/2004 | Kada et al. | |
| 7,734,002 B2 * | 6/2010 | Yi | H03D 13/004 |
| | | | 327/156 |
| 2004/0196052 A1 | 10/2004 | Okayasu | |
| 2007/0096785 A1 | 5/2007 | Maeda | |
| 2009/0033387 A1 * | 2/2009 | Heragu | H03L 7/0814 |
| | | | 327/158 |
| 2009/0051396 A1 | 2/2009 | Shimamoto | |

OTHER PUBLICATIONS

International Search Report and Written Opinion from PCT/US2019/017545, dated May 24, 2019, 12 pages.

* cited by examiner

*Primary Examiner* — John W Poos
(74) *Attorney, Agent, or Firm* — Morgan, Lewis & Bockius LLP (57) ABSTRACT

Disclosed are methods and apparatuses for providing direct measurement delay calibration. An apparatus may include a plurality of delay elements in a loop. The apparatus may also include a controller coupled to the plurality of delay elements. The controller may be configured to cause determining, for a predetermined time period, delay oscillations from the plurality of delay elements in the loop. The controller may also be configured to cause determining, based on the determined delay oscillations, the predetermined time period, and a quantity of the plurality of delay elements, a subset of the plurality of delay elements for delaying an input signal. The controller may also be configured to cause routing the input signal through the subset of the plurality of delay elements.

20 Claims, 7 Drawing Sheets

DIRECT MEASUREMENT DELAY CALIBRATION METHOD AND APPARATUS

CROSS-REFERENCE TO RELATED APPLICATIONS

This application is a nonprovisional of U.S. Application Ser. No. 62/681,018, entitled "DIRECT MEASUREMENT DELAY CALIBRATION METHOD AND APPARATUS," filed on Jun. 5, 2018, the entirety of which is incorporated herein by reference.

BACKGROUND

Delays can perform many useful functions in digital circuit designs. For example, delays may adjust a data bus strobe signal (DQS) for reading and writing optimally at the center of data. Delays may also lengthen or shorten the arrival time of signals, change relative signal phases, provide setup or initialization time, or adjust skew on data bus signals (DQ) for edge transition alignment. Implementing a delay locked loop (DLL) is often the default approach to provide such delays. However, the DLL approach suffers from several drawbacks such as higher power consumption requirements and lower delay accuracy.

BRIEF DESCRIPTION OF THE DRAWINGS

A detailed description will be made with reference to the accompanying drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

One or more implementations of methods and apparatuses are provided for direct measurement delay calibration. In a calibration mode, delay elements may be arranged in a loop that provides oscillations. A counter may count the oscillations from the loop. A controller may obtain an oscillation count from the counter after a predetermined time period elapses against a reference clock. The controller may then use the oscillation count to determine the total delay time and/or a delay time for at least a representative one of the delay elements. Delay element settings for input signals may be determined using the delay time and nominal delay settings for the input signals, and the calibration mode may be turned off to switch to an operational mode.

In the operational mode, the loop is reconfigured into groups of delay elements allocated for respective input signals, and the controller may route the input signals through subsets of delay elements in the respective groups to achieve delays according to the delay element settings. It should be noted that hardware circuits such as counters and controllers described herein may be implemented using hardware, software (including firmware), or a combination of hardware and software (including firmware).

The direct measurement delay calibration leverages an observation that in many applications and use cases, such as a storage device controller that communicates with memory devices over a data bus, there are periods of inactivity where no data is transferred over the data bus. During these periods of inactivity, the calibration mode may be enabled to calibrate delays for data signals on the data bus, as described herein. Since the calibration mode may be carried out periodically and/or opportunistically during periods of inactivity, the delay element settings can dynamically adapt to changes in skew and delay performance that may result from operational wear, temperature changes, environmental changes, and other factors. After switching to operational mode, data read from or written to the data bus is delayed according to the delay element settings determined from the most recent calibration mode.

One or more aspects of the subject technology provide several performance benefits that improve the functionality of a computer. As discussed above, DLL approaches suffer from several drawbacks, one of which is limited delay accuracy. Since DLL approaches measure delay time of a DLL master that is assumed to be similar to but is a separate entity from DLL slaves used for providing the delay, any mismatches between the master and slaves introduce delay errors. Further, because the delay time is measured by using phase locking on the DLL master, tracking and quantization errors are introduced that can further reduce delay accuracy by 5% or more. Since these errors are inherent to the DLL master/slave approach, there are limited options for reducing these errors. On the other hand, since one or more implementations of the subject technology measure the delay time using the same delay elements that provide the delays, the errors associated with the DLL master/slave approach can be eliminated.

Additionally, one or more aspects of the subject technology can meet a desired accuracy threshold or error tolerance for delays by allowing the calibration mode to proceed for a minimum number of cycles. For example, the predetermined time period for the calibration mode may be set so that approximately 100 cycles are counted, which may provide an error tolerance of approximately 1-2% due to phase misalignment of the oscillations provided to the counter. If a tighter error tolerance is required, then the predetermined time period can be increased.

DLL approaches also suffer from increased power consumption. For example, the DLL master is in constant operation even when the data bus is idle. Additionally, since the DLL slaves are essentially mirrors of the DLL master, a large number of gates, delay elements, multiplexers, and other circuit elements may be required, especially for a wide data bus. Since the DLLs must accommodate the input signal with the largest delay adjustment range, a large number of redundant delay elements may be provided for DLL slaves that do not require such a large delay adjustment range. Accordingly, the DLL approach results in higher power consumption, which is undesirable for mobile devices with limited battery power, as well as for high-density data center applications where power inefficiencies can reduce reliability and manageability.

One or more aspects of the subject technology can provide reduced power consumption by omitting an always-on DLL master and by providing a minimal number of delay elements needed to accommodate delay adjustment ranges customized for each input signal. For example, the data strobe (DQS) signal can be provided with a larger maximum number of delay elements for a larger delay adjustment range suitable for adjusting the data strobe, whereas the data signals (DQ) can be provided with a smaller maximum number of delay elements for a smaller delay adjustment range suitable for adjusting skew. In this manner, superfluous gates and circuit elements may be eliminated to reduce power consumption.

Further, one or more aspects of the subject technology can reduce the design and fabrication costs for application specific integrated circuits (ASICs). For example, the delay elements used by the direct measurement delay calibration can be implemented using delay elements commonly available in ASIC design software. As a result, ASIC designs can save costs by removing dependence on proprietary vendor designs for DLL master and slave architectures. The ASIC designer can reallocate these savings to add or upgrade other components in an associated bill of materials (BOM), thereby providing higher performance, higher reliability, or other improvements.

Thus, one or more aspects of the direct measurement delay calibration provide several performance advantages that improve the functioning of digital circuits requiring delays for a data bus. In turn, a storage device controller that uses the direct measurement delay calibration to communicate with one or more memory devices on the data bus is also provided with improved functioning. A host computer that interfaces with the storage device is also provided with improved functioning. Thus, the direct measurement delay calibration provides performance benefits that improve the functioning of a storage device controller and a host computer.

Figure 1:
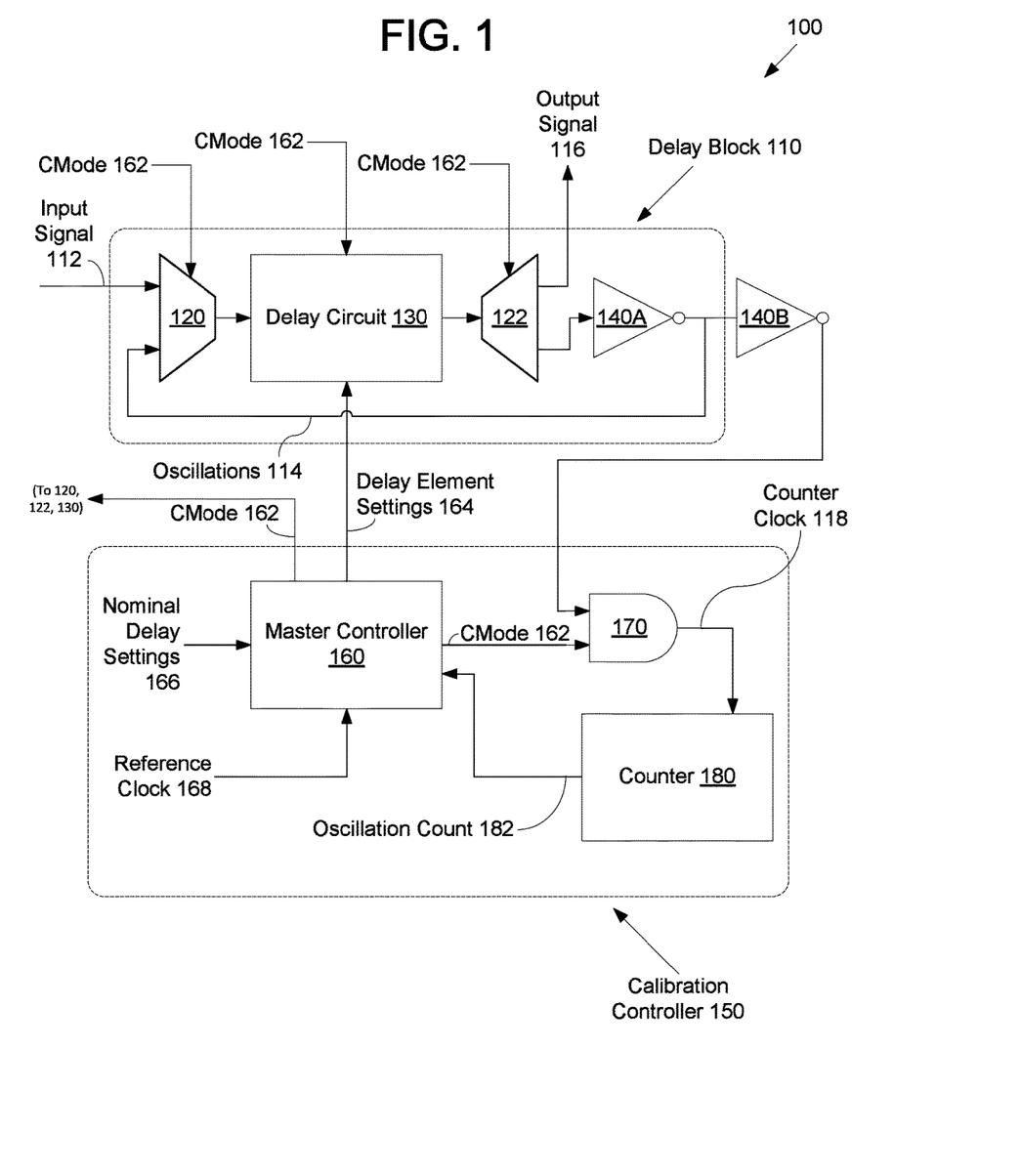
FIG. 1 is a circuit diagram illustrating an example apparatus for providing direct measurement delay calibration.

FIG. 1 is a circuit diagram illustrating an example apparatus for providing direct measurement delay calibration. Delay calibration circuit 100 of FIG. 1 includes delay block 110, inverter 140B, and calibration controller 150. Delay block 110 includes multiplexer 120, demultiplexer 122, delay circuit 130, and inverter 140A. Delay block 110 receives input signal 112 and CMode 162 (Calibration Mode). Delay block 110 outputs output signal 116 and oscillations 114. Calibration controller 150 includes counter clock 118, master controller 160, CMode 162, nominal delay settings 166, reference clock 168, logic gate 170, counter 180, and oscillation count 182. Calibration controller 150 receives an inverted version of oscillations 114 from inverter 140B. Calibration controller 150 outputs CMode 162 and delay element settings 164.

Master controller 160 may enter into the calibration mode, or CMode 162 may be set to "True" (high or asserted) when the data bus (not shown in FIG. 1) is idle. Prior to entering the calibration mode, CMode 162 may be set to "False" (low or non-asserted) for an operational mode. To provide reliable and quiet switching into the calibration mode, input signal 112 may be held high for a period of time, then input signal 112 may be set to low and CMode 162 may be switched from "False" to "True." The period of time held high may be set long enough to avoid high frequency noise induced by the switching.

Once CMode 162 is set to "True," delay block 110 may comprise a ring oscillator. For example, multiplexer 120 may select the bottom input signal, or oscillations 114, and demultiplexer 122 may select the bottom output signal coupled to inverter 140A. As shown in delay block 110, the output of inverter 140A produces oscillations 114 and is coupled to the bottom input of multiplexer 120. Due to the presence of delay circuit 130 and inverter 140A in delay block 110, oscillations 114 are generated. Inverter 140A and inverter 140B may be inverting amplifiers to maintain a voltage level for oscillations 114.

For example, if an output of multiplexer 120 is initially high or digital 1, then it is held at that high state for a period of time according to delay circuit 130, and inverter 140A flips the state to low or digital 0 afterwards. Since oscillations 114 is fed back into multiplexer 120 in delay block 110, the output of multiplexer 120 is now low or digital 0, delay circuit 130 holds the low state for the same period of time, and inverter 140A flips the state to high or digital 1.

The above process repeats such that oscillations 114 alternate between digital 1 and 0 or high and low states. The time period that includes one high state and one low state may be an oscillation period, which may be a constant period defined by delay circuit 130. For example, delay circuit 130 may include a quantity of delay elements that provide a total delay for delay circuit 130, which corresponds to half a period for oscillations 114. The delay elements may be organized into groups that are assigned for respective input signals of input signal 112. In alternative embodiments, oscillations 114 may be produced using components not shown in FIG. 1.

Besides feeding back into multiplexer 120, oscillations 114 are also coupled to inverter 140B. Inverter 140B may output an inverted version (or a phase shifted version) of oscillations 114. In one or more implementations of the subject technology, inverter 140B may be omitted. As shown in FIG. 1, the inverted version of oscillations 114 is coupled to logic gate 170. Logic gate 170 is also coupled to CMode 162 from master controller 160. Logic gate 170 may be an AND gate. Thus, the inverted version of oscillations 114 only passes through logic gate 170 to become counter clock 118 when CMode 162 is set to "True."

As shown in calibration controller 150, counter clock 118 is coupled to counter 180. Counter 180 may increment a count for each period or cycle received in counter clock 118. The count may be initialized to a zero value by master controller 160 when CMode 162 is switched from "False" to "True," or when the calibration mode is entered. Alternatively, master controller 160 may read a present value of the count from counter 180 when the calibration mode is entered.

When the calibration mode is entered, master controller 160 may record a present time as indicated by reference clock 168, which may include a clock signal with a known frequency, such as a signal from a crystal oscillator. Based on reference clock 168, master controller 160 can determine a present wall clock time. Thus, master controller 160 can run the calibration mode for a predetermined period of time based on reference clock 168. Once the predetermined period of time has elapsed, master controller 160 may retrieve oscillation count 182 from counter 180. The previously retrieved count from counter 180 may be subtracted from oscillation count 182 when the count was not initialized to zero.

Once oscillation count 182 is determined, master controller 160 may generate delay element settings 164 based on or according to nominal delay settings 166. Nominal delay settings 166 may define target delays for each input signal of input signal 112. Master controller 160 may then switch CMode 162 to "False" for operational mode, which may reconfigure delay block 110 into groups of delay elements for delaying respective input signals of input signal 112. The reconfiguration may be provided using multiplexers and demultiplexers in delay block 110, for example. The input signals may be routed into subsets of delay elements for respective groups of delay elements in delay circuit 130 according to delay element settings 164.

Having provided a circuit overview for an apparatus providing direct measurement delay calibration, it may be instructive to examine delay circuit 130 in more detail. For simplicity, delay circuit 130 shall be explained separately in calibration mode and operational mode, corresponding to FIG. 2A and FIG. 2B respectively.

Figure 2A:
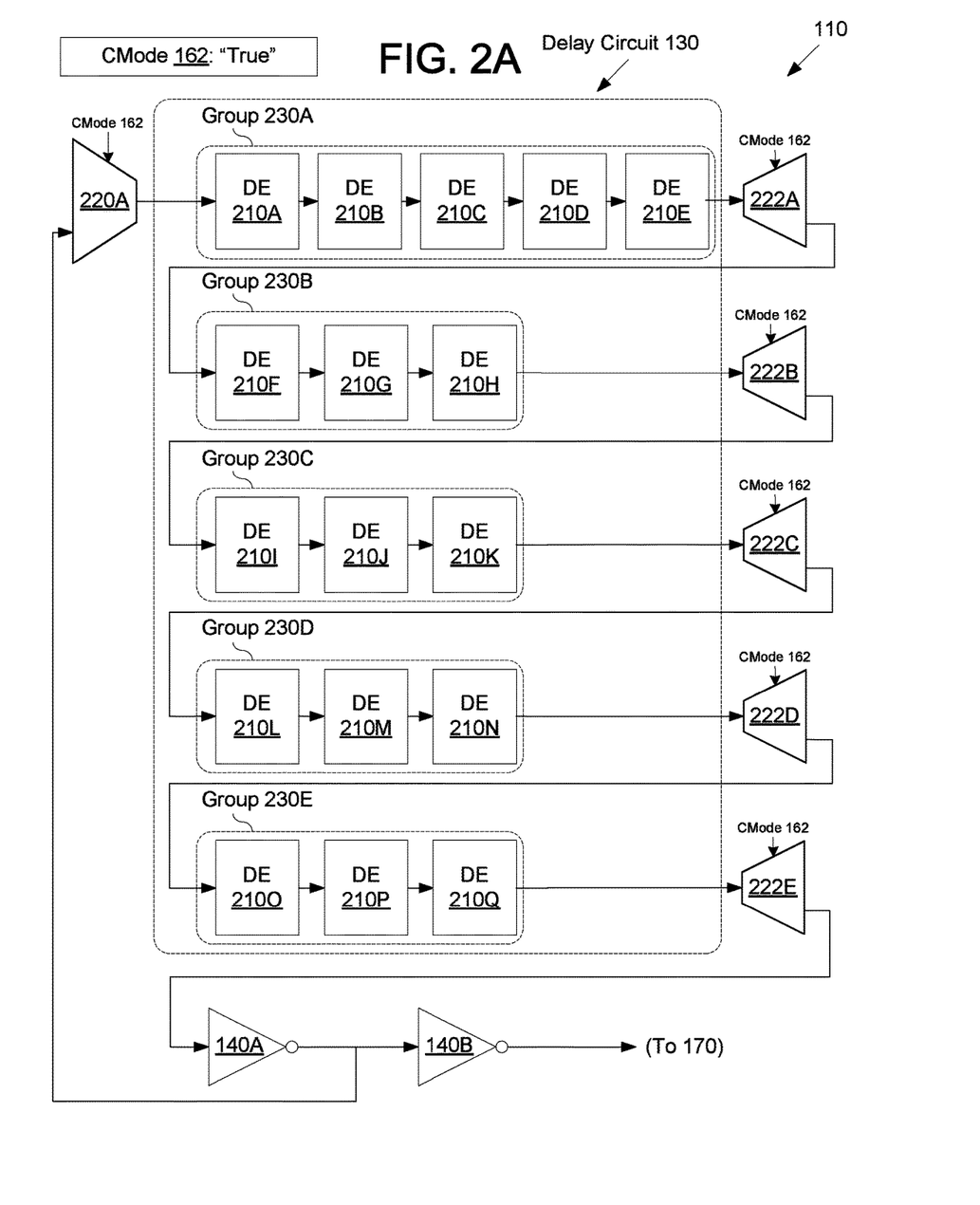
FIG. 2A is a circuit diagram illustrating the delay circuit of FIG. 1 in a calibration mode.

FIG. 2A is a circuit diagram illustrating delay circuit 130 of FIG. 1 in a calibration mode. FIG. 2A includes delay block 110 and CMode 162. Delay block 110 includes delay circuit 130, inverter 140A, inverter 140B, multiplexer 220A, demultiplexer 222A, demultiplexer 222B, demultiplexer 222C, demultiplexer 222D, and demultiplexer 222E. Delay circuit 130 includes group 230A, group 230B, group 230C, group 230D, and group 230E. Group 230A includes delay element (DE) 210A, DE 210B, DE 210C, DE 210D, and DE 210E. Group 230B includes DE 210F, de 210G, and DE 210H. Group 230C includes DE 210I, DE 210J, AND DE 210K. Group 230D includes DE 210L, DE 210M, and DE 210N. Group 230E includes DE 210O, DE 210P, and DE 210Q. With respect to FIG. 2A, like numbered elements may correspond to similar elements from FIG. 1.

As shown in FIG. 2A, delay circuit 130 includes a number of delay elements, or DE 210A-210Q. Multiplexer 220A receives the output from inverter 140A and outputs to the first delay element in delay circuit 130, or DE 210A. Further, as shown in delay circuit 130, DE 210A-210Q are divided into groups 230A-230E, which may be allocated for respective input signals. For example, group 230A may be allocated for a data strobe (DQS), whereas groups 230B-230E may be allocated for a respective data signal (DQ) on a 4-bit data bus. Greater or fewer groups may be provided in delay circuit 130 to accommodate a desired number of signals for a data bus of any width.

When CMode 162 is set to "True" as in FIG. 2A, then the groups 230A-230E may be configured to be connected in series by respective demultiplexers 222A-222E, with group 230E feeding back into group 230A via inverter 140A and multiplexer 220A. Thus, delay circuit 130 is configured as 17 delay elements DE 210A-210Q connected in series and looping in delay block 110 with inverter 140A. While separate demultiplexers 222A-222E are shown in FIG. 2A, in one or more implementations of the subject technology, multiple multiplexers/demultiplexers may consolidate into multi-input/multi-output multiplexers/demultiplexers.

Since a maximum number of delay elements is fixed for each group 230A-230E, master controller 160 may be configured with constants corresponding to the maximum quantity of delay elements for each group 230A-230E, or 5, 3, 3, 3, and 3 delay elements. Further, master controller 160 can derive a total quantity of delay elements in delay circuit 130 by summing the maximum quantity of delay elements for all the groups, or 5+3+3+3+3=17 delay elements, which may be stored as a constant. When oscillations are output after inverter 140B to logic gate 170, master controller 160 can determine that each oscillation period counted by counter 180 in oscillation count 182 corresponds to 17*2 or 34 delay elements. The total quantity of delay elements is multiplied by two since each oscillation period includes a high signal and a low signal that are each held for a half of the oscillation period using delay circuit 130.

Note that for simplicity of illustration, some elements that are used in the calibration mode are not shown in FIG. 2A. For example, multiplexers 220B, 220C, 220D, and 220E (shown in FIG. 2B) may be present but are not shown in delay block 110 of FIG. 2A for simplicity. Additionally, demultiplexers 240A-240E (shown in FIG. 2B) may be present but are not shown in delay circuit 130 of FIG. 2A for simplicity. Thus, when in the calibration mode where CMode 162 is set to "True," the outputs of demultiplexers 222A-222D may actually be routed to a next respective multiplexer 220B-220E. The outputs from multiplexer 220A-220E may actually be routed to a corresponding demultiplexer 240A-240E in delay circuit 130. Demultiplexers 240A-240E may select the first delay element in respective groups 230A-230E, or DE 210A, 210F, 210I, 210L, and 210O.

Figure 2B:
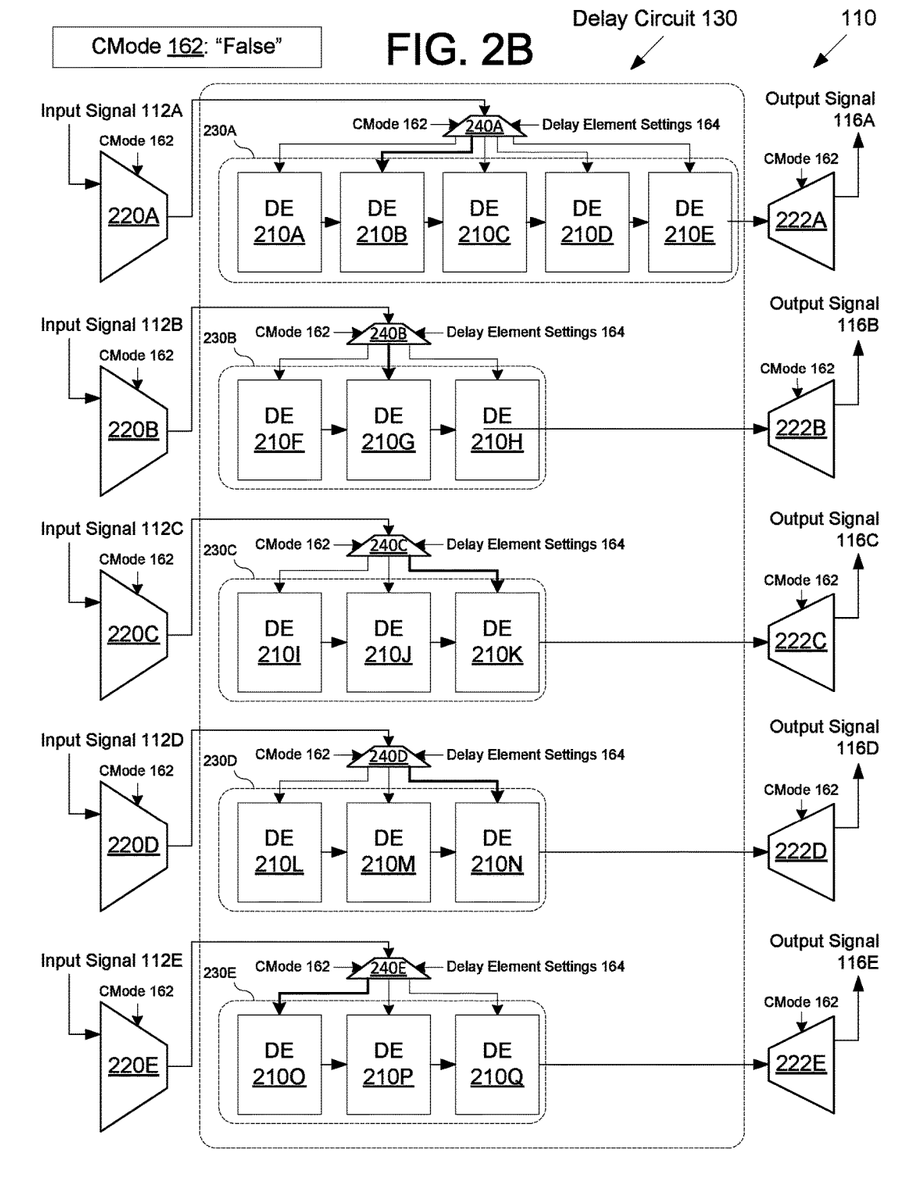
FIG. 2B is a circuit diagram illustrating the delay circuit of FIG. 1 in an operational mode.

FIG. 2B is a circuit diagram illustrating delay circuit 130 of FIG. 1 in an operational mode. FIG. 2B includes delay block 110 and CMode 162. Delay block 110 includes delay circuit 130, multiplexer 220A, multiplexer 220B, multiplexer 220C, multiplexer 220D, multiplexer 220E, demultiplexer 222A, demultiplexer 222B, demultiplexer 222C, demultiplexer 222D, and demultiplexer 222E. Delay circuit 130 includes group 230A, group 230B, group 230C, group 230D, group 230E, demultiplexer 240A, demultiplexer 240B, demultiplexer 240C, demultiplexer 240D, and demultiplexer 240. Group 230A includes DE (delay element) 210A, DE 210B, DE 210C, DE 210D, and DE 210E. Group 230B includes DE 210F, de 210G, and DE 210H. Group 230C includes DE 210I, DE 210J, AND DE 210K. Group 230D includes DE 210L, DE 210M, and DE 210N. Group 230E includes DE 210O, DE 210P, and DE 210Q. With respect to FIG. 2B, like numbered elements may correspond to similar elements from FIG. 2A and FIG. 1.

As shown in FIG. 2B, when CMode 162 is set to "False" or an operational mode, delay block 110 is reconfigured to route input signals 112A-112E to respective selectable subsets of groups 230A-230E according to delay element settings 164. Thus, delay block 110 is no longer a loop of delay elements in series as in FIG. 2A, but instead delay block 110 now provides the delays for the input signals (without a feedback). Note that the same delay elements 210A-210Q are used for measuring the delay time in FIG. 2A in calibration mode and applying the delays in FIG. 2B in operational mode. Thus, the drawbacks of using a DLL master/slave configuration can be avoided, as described above.

For example, referring to group 230A, demultiplexer 240A receives CMode 162 and delay element settings 164 to determine a subset of delay elements for routing input signal 112A. Demultiplexer 240A can choose from five possible subsets: (1) DE 210A-210E, (2) DE 210B-210E, (3) DE 210C-210E, (4) DE 210D-210E, or (5) just DE 210E. In the example illustrated in FIG. 2A, demultiplexer 240A chooses subset 2, or DE 210B-210E, as indicated by the bolded path line. Thus, CMode 162 may be set to "False" as indicated, and delay element settings 164 may indicate starting from DE 210B for group 230A. A similar process may occur for the other groups 230B-230E. After routing through the respective subset of delay elements, the input signals 112A-112E may provide corresponding delayed output signals 116A-116E. Note that the groups 230A-230E and the associated subsets are isolated and independent from each other when CMode 162 is set to "False," allowing delays to be applied independently and in parallel for each input signal 112A-112E.

As discussed above, when CMode 162 is instead set to "True," then the demultiplexers 240A-240E may select the first delay element in each group to select the entire group as the subset for each group. The demultiplexers 222A-222E also route to the next group, rather than to output signals 116A-116E.

Note that the maximum number of delay elements, and thus the selectable range of delays, can vary for each group. In the example shown in FIG. 2B, group 230A for input signal 112A corresponding to a clock signal or data strobe (DQS) can select up to 5 delay elements for a subset, whereas groups 230B-230E for input signals 112B-112E corresponding to data line signals (DQ) can select up to 3 delay elements for a subset. While each data line has the same number of maximum delay elements in FIG. 2B, one or more implementations of the subject technology may have different numbers of maximum delay elements for each data line. In one or more aspects, a subset of a group may include one delay element of the group, two or more delay elements of the group, or all of the delay elements of the group. In one or more aspects, a subset of a plurality of delay elements may include one of the plurality of delay elements, two or more of the plurality of delay elements, or all of the of the plurality of delay elements.

Thus, the number of delays elements in delay circuit 130 can be set according to the delay range requirements for each associated input signal. For example, since data strobe (DQS) may require a larger adjustment range compared to adjusting for data skew on data lines (DQ), the maximum number of delay elements in group 230A, or 5, may be greater than the maximum number of delay elements for groups 230B-230E, or 3. Thus, rather than providing 5 delay elements for all groups, delay circuit 130 can provide a customized number of delay elements for each group, thereby minimizing the number of gates and other circuitry while still providing delays with sufficient predetermined adjustment ranges for each input signal 112A-112E. As a result, power consumption can be reduced compared to PLL master/slave configurations.

Figure 3:
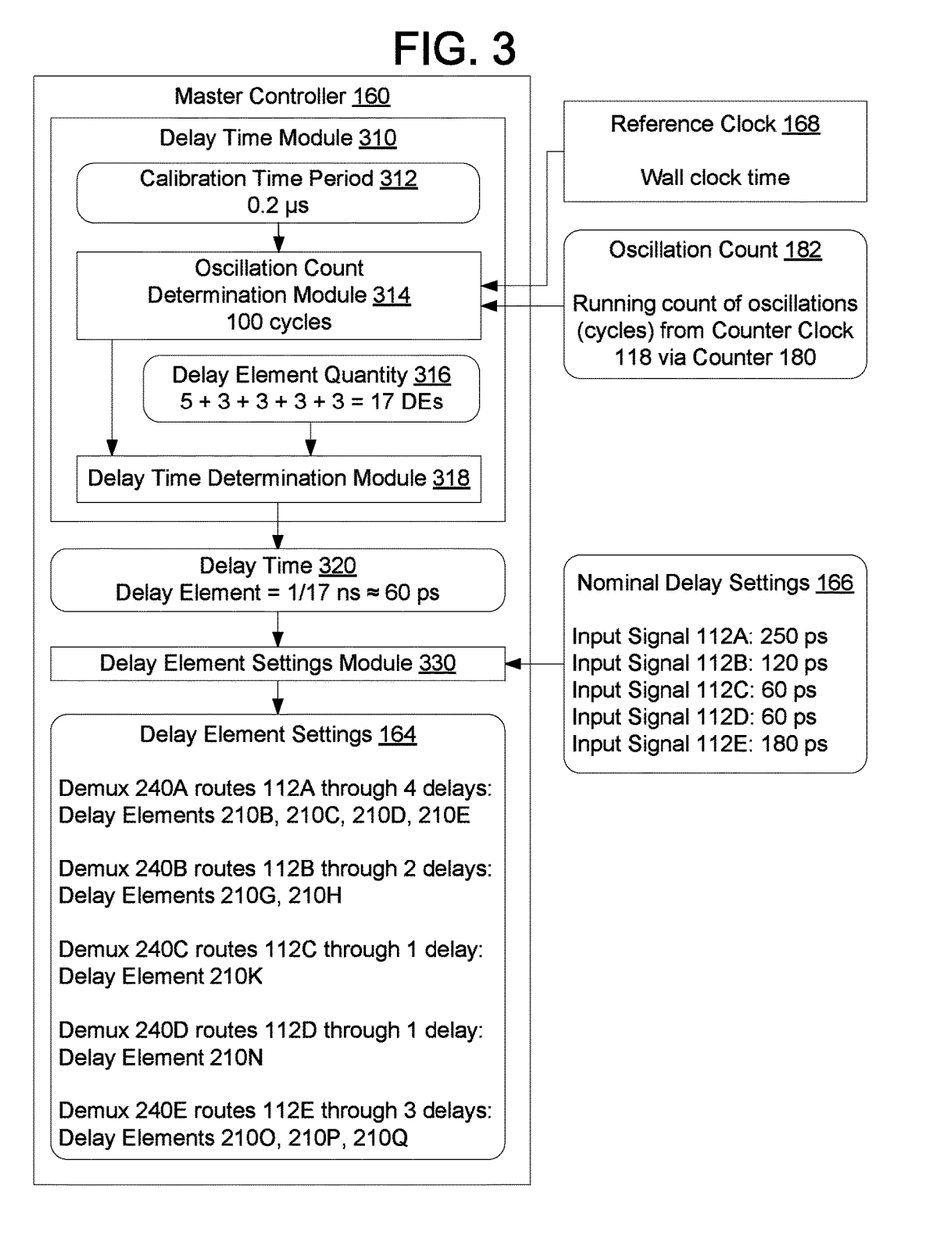
FIG. 3 is a diagram illustrating an example data flow for the master controller of FIG. 1.

FIG. 3 is a diagram illustrating an example data flow for the master controller of FIG. 1. FIG. 3 includes master controller 160, nominal delay settings 166, reference clock 168, and oscillation count 182. Master controller 160 includes delay time module 310, delay time 320, delay element settings module 330, and delay element settings 164. Delay time module 310 includes calibration time period 312, oscillation count determination module 314, delay element quantity 316, delay time determination module 318. With respect to FIG. 3, like numbered elements may correspond to the same elements from FIG. 1.

Figure 4:
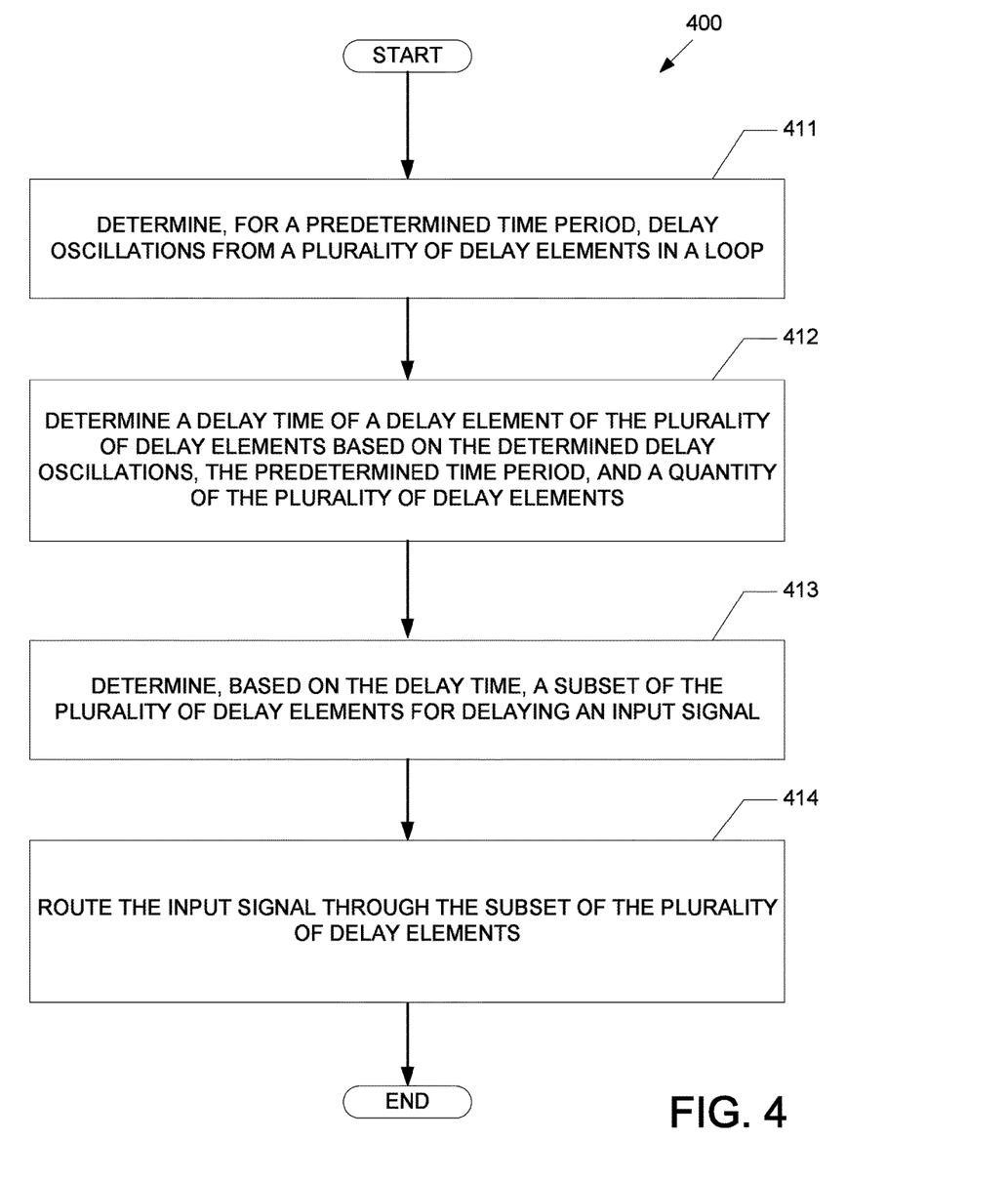
FIG. 4 is a flowchart illustrating an example process for providing direct measurement delay calibration.

The data flow shown in FIG. 3 may be better understood in the context of FIG. 4, a flowchart illustrating an example process 400 for providing direct measurement delay calibration. One or more blocks of FIG. 4 may be executed by a computing system (including, e.g., a controller of a flash memory, a data storage controller of an SSD, a processor, or the like). Similarly, a non-transitory machine-readable medium may include machine-executable instructions thereon that, when executed by a computer or machine, perform the blocks of FIG. 4.

In block 411, referring to FIG. 3 and FIG. 1, master controller 160 may determine, for calibration time period 312, delay oscillations from delay elements in delay block 110. As shown in FIG. 3, the number of delay elements in delay circuit 130 of delay block 110 may be stored or determined by delay time module 310 as delay element quantity 316, or 17 delay elements in this example. Delay time module 310 may use reference clock 168 as a "stopwatch" to determine when calibration time period 312 has elapsed after entry into calibration mode, or 0.2 μs after CMode 162 is asserted as "True" in this example. Once this condition has been satisfied, oscillation count determination module 314 may receive oscillation count 182 from counter 180, which keeps a running count of oscillations from counter clock 118. In this example, oscillation count determination module 314 determines 100 delay oscillations (also referred to as cycles or periods) from the 17 delay elements in delay block 110 after 0.2 μs has elapsed after entering the calibration mode.

As discussed above, the calibration time period 312 may be set to provide a minimum number of cycles to meet an accuracy threshold for a specified error tolerance for the delays. For example, if a maximum delay (i.e. the summed delay of all of the delay elements) of delay circuit 130 is known, for example 1 ns, then the maximum delay per cycle or period is known to be double that, or 2 ns. Depending on the frequency of the data bus, more time may be necessary to measure the cycles. For a 500 MHz, double data rate or 1000 MT/s data bus, 1,000,000,000 transfers occur per second, or 1 cycle per 2 ns, and thus the bus speed is not a limiting factor in this example.

If 100 cycles is the minimum number of cycles to meet an accuracy threshold or error tolerance of 1-2% for the delays, then the required calibration time period=(maximum delay per cycle)*(minimum number of cycles)=(2 ns/1 cycle)*(100 cycles)=200 ns=0.2 μs. Thus, calibration time period 312 can be set to 0.2 μs to provide a 1-2% error tolerance in this example. With a longer calibration time period 312, a tighter error tolerance can be specified, in contrast to DLL master/slave configurations with limited options for reducing delay errors.

In block 412, referring to FIG. 3 and FIG. 1, master controller 160 may determine delay time 320 of a representative delay element of the delay elements in delay block 110 based on the determined 100 cycles of oscillation count determination module 314, the 0.2 μs of calibration time period 312, and the 17 delay elements of delay element quantity 316. For example, the following equation may be used:

$$x/y=1/(2*t*\text{de}) \qquad \text{Equation 1}$$

wherein x is the determined cycles of oscillation count determination module 314, wherein y is calibration time period 312, wherein t is delay time 320 of a representative delay element in delay block 110, and wherein de is delay element quantity 316.

By using the example data values shown in FIG. 3, Equation 1 becomes 100/0.2 μs=1/(2*t*17). To determine delay time 320, delay time determination module 318 may use Equation 1 to solve for t, which results in t=1/17 ns, or approximately 60 ps, as indicated in delay time 320 of FIG. 3.

In block 413, referring to FIG. 3 and FIG. 1, master controller 160 may determine, based on delay time 320, a subset of the delay elements in delay block 110 for delaying input signal 112. For example, the determination in block 413 may be based on delay element settings module 330 using nominal delay settings 166, or a target delay that is known for input signal 112.

For example, the nominal delay settings 166 in FIG. 3 indicate that input signal 112A should be delayed by 250 ps. To best approximate this delay, delay elements settings module 330 may determine that routing input signal 112A through 4 delays will best approximate the target 250 ps delay since delay time 320 is 60 ps, and 60 ps*4=240 ps 250 ps. Accordingly, delay element settings 164 may include the setting that demultiplexer 240A should route input signal 112A through 4 delays in group 230A, or the subset that includes delay elements 210B, 210C, 210D and 210E, as also illustrated in FIG. 3B. This may be represented in data by only specifying the starting delay element for each group, e.g. delay element 210B for group 230A corresponding to demultiplexer 240A. A similar process may be carried out to determine the remainder of delay element settings 164 for input signals 112B-112E in FIG. 3.

Note that delay element settings module 330 uses delay time 320 determined by the last or most recent calibration. As discussed above, the calibration mode may be scheduled during idle time on the data bus when reads or writes are not occurring. Due to the nature of data traffic for applications such as storage devices, there may be opportunities to conduct periodic calibration during idle times between bursts of data traffic. Thus, even if delay time 320 fluctuates due to temperature changes, device wear, or other environmental effects, accurate delays can be dynamically provided for the input signals. For example, if delay time 320 changes from 60 ps to 120 ps due to the last calibration mode, then delay element settings 164 may instead specify routing input signal 112A through 2 delays, or delay elements 210D and 210E.

In block 414, referring to FIG. 3 and FIG. 1, master controller 160 routes the input signal 112 through the subset of the delay elements in delay block 110 according to delay element settings 164. Thus, CMode 162 may be asserted to "False" to change to operational mode. Referring to FIG. 1, FIG. 2B, and delay element settings 164 in FIG. 3, master controller 160 may provide delay element settings 164 to respective demultiplexers 240A-240E so that input signals 112A-112E are routed through respective subsets of groups 230A-230E to generate delayed output signals 116A-116E. For example, input signal 112A is routed through a subset of group 230A including delay elements 210B-210E, input signal 112B is routed through a subset of group 230B including delay elements 210G-210H, input signal 112C is routed through a subset of group 230C including delay element 210K, input signal 112D is routed through a subset of group 230D including delay element 210N, and input signal 112E is routed through a subset of group 230E including delay elements 210O-210Q.

As discussed above, the calibration mode may be engaged during idle time on the data bus. Thus, blocks 411-413 may be repeated on a periodic and/or opportunistic basis to dynamically update delay time 320.

Figure 5:
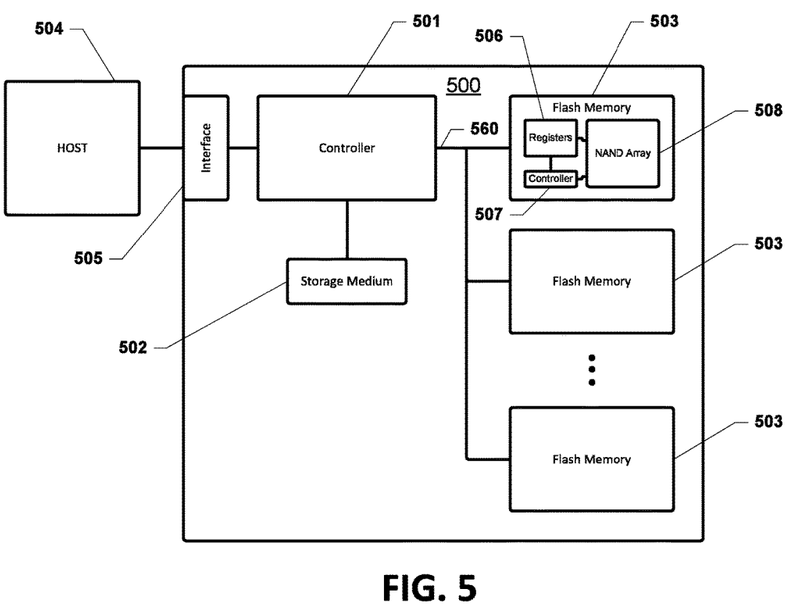
FIG. 5 is a block diagram illustrating components of an example data storage system.

FIG. 5 is a block diagram illustrating components of an example data storage system, according to one or more implementations of the subject technology. As depicted in FIG. 5, in some implementations, data storage system 500 (e.g., a solid state drive) includes data storage controller 501, storage medium 502, flash memory 503, and data bus 560.

Controller 501 may use storage medium 502 for temporary storage of data and information used to manage data storage system 500. Controller 501 may include several internal components (not shown) such as a read-only memory, a flash component interface (e.g., a multiplexer to manage instruction and data transport along a serial connection to flash memory 503), an I/O interface, error correction circuitry, and the like. In some aspects, all of these elements of controller 501 may be integrated into a single chip. In other aspects, these elements may be separated on their own PC board.

In some implementations, aspects of the subject disclosure may be implemented in data storage system 500. For example, aspects of the subject disclosure may be integrated with the function of data storage controller 501 or may be implemented as separate components for use in conjunction with data storage controller 501.

Controller 501 may also include a processor that may be configured to execute code or instructions to perform the operations and functionality described herein, manage request flow and address mappings, and to perform calculations and generate commands. The processor of controller 501 may be configured to monitor and/or control the operation of the components in data storage controller 501. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 501 and/or its processor. One or more sequences of instructions may be software stored and read from storage medium 502, flash memory 503, or received from host device 504 (e.g., via host interface 505). ROM, storage medium 502, flash memory 503, represent examples of machine or computer readable media on which instructions/code executable by controller 501 and/or its processor may be stored. Machine or computer readable media may generally refer to any medium or media used to provide instructions to controller 501 and/or its processor, including volatile media, such as dynamic memory used for storage media 502 or for buffers within controller 501, and non-volatile media, such as electronic media, optical media, and magnetic media.

In some aspects, controller 501 may be configured to store data received from a host device 504 in flash memory 503 in response to a write command from host device 504. Controller 501 is further configured to read data stored in flash memory 503 and to transfer the read data to host device 504 in response to a read command from host device 504.

Host device 504 represents any device configured to be coupled to data storage system 500 and to store data in data storage system 500. Host device 504 may be a computing system such as a personal computer, a server, a workstation, a laptop computer, PDA, smart phone, and the like. Alternatively, host device 504 may be an electronic device such as a digital camera, a digital audio player, a digital video recorder, and the like.

In some aspects, storage medium 502 represents volatile memory used to temporarily store data and information used to manage data storage system 500. According to aspects of the subject technology, storage medium 502 is random access memory (RAM) such as double data rate (DDR) RAM. Other types of RAM also may be used to implement storage medium 502. Memory 502 may be implemented using a single RAM module or multiple RAM modules.

While storage medium 502 is depicted as being distinct from controller 501, those skilled in the art will recognize that storage medium 502 may be incorporated into controller 501 without departing from the scope of the subject technology. Alternatively, storage medium 502 may be a non-volatile memory such as a magnetic disk, flash memory, peripheral SSD, and the like.

As further depicted in FIG. 5, data storage system 500 may also include host interface 505. Host interface 505 may be configured to be operably coupled (e.g., by wired or wireless connection) to host device 504, to receive data from host device 504 and to send data to host device 504. Host interface 505 may include electrical and physical connections, or a wireless connection, for operably coupling host device 504 to controller 501 (e.g., via the I/O interface of controller 501). Host interface 505 may be configured to communicate data, addresses, and control signals between host device 504 and controller 501. Alternatively, the I/O interface of controller 501 may include and/or be combined with host interface 505. Host interface 505 may be configured to implement a standard interface, such as Serial-Attached SCSI (SAS), Fiber Channel interface, PCI Express (PCIe), SATA, USB, and the like. Host interface 505 may be configured to implement only one interface. Alternatively, host interface 505 (and/or the I/O interface of controller 501) may be configured to implement multiple interfaces, which may be individually selectable using a configuration parameter selected by a user or programmed at the time of assembly. Host interface 505 may include one or more buffers for buffering transmissions between host device 504 and controller 501.

Flash memory 503 represents a non-volatile memory device for storing data. According to aspects of the subject technology, flash memory 503 includes, for example, a NAND flash memory. Flash memory 503 may include a single flash memory device or chip, or, as depicted by FIG. 5, may include multiple flash memory devices or chips arranged in multiple channels. Flash memory 503 is not limited to any particular capacity or configuration. For example, the number of physical blocks, the number of physical pages per physical block, the number of sectors per physical page, and the size of the sectors may vary within the scope of the subject technology.

Flash memory may have a standard interface specification so that chips from multiple manufacturers can be used interchangeably (at least to a large degree). The interface hides the inner working of the flash and returns only internally detected bit values for data. In aspects, the interface of flash memory 503 is used to access one or more internal registers 506 and an internal flash controller 507 for communication by external devices. In some aspects, registers 506 may include address, command, and/or data registers, which internally retrieve and output the necessary data to and from a NAND memory cell array 508. For example, a data register may include data to be stored in memory array 508, or data after a fetch from memory array 508, and may also be used for temporary data storage and/or act like a buffer. An address register may store the memory address from which data will be fetched to host 504 or the address to which data will be sent and stored. In some aspects, a command register is included to control parity, interrupt control, and the like. In some aspects, internal flash controller 507 is accessible via a control register to control the general behavior of flash memory 503. Internal flash controller 507 and/or the control register may control the number of stop bits, word length, receiver clock source, and may also control switching the addressing mode, paging control, coprocessor control, and the like.

In some aspects, registers 506 may also include a test register. The test register may be accessed by specific addresses and/or data combinations provided at the interface of flash memory 503 (e.g., by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of flash memory 503 (e.g., read levels) to dynamically vary how data is read from the memory cells of memory arrays 508.

It should be understood that in all cases data may not always be the result of a command received from host 504 and/or returned to host 504. In some aspects, Controller 501 may be configured to execute a read operation independent of host 504 (e.g., to verify read levels or BER). The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

In one or more examples, controller 501 may include delay calibration circuit 100. Controller 501 may perform the operations identified in blocks 411-414. Controller 501 may cause the operations identified in blocks 411-414 to occur.

In one or more examples, the functionality of delay calibration circuit 100 may be implemented as software and may be stored in storage medium 502. In one or more examples, functionality of calibration controller 150, including master controller 160, logic gate 170, and counter 180 may be implemented as a combination of software (in storage medium 502) and hardware in controller 501. The instructions, which cause or facilitate controller 501 to perform operations identified in blocks 411-414, may be stored in storage medium 502. Controller 501 may execute instructions stored in storage medium 502.

In one or more examples, controller 501 may include, generate, provide, cause storing of, or receive delay element settings 164. For example, delay element settings 164 may be stored in storage medium 502 for access by controller 501, or within storage elements in controller 501 (not shown).

Figure 6A:
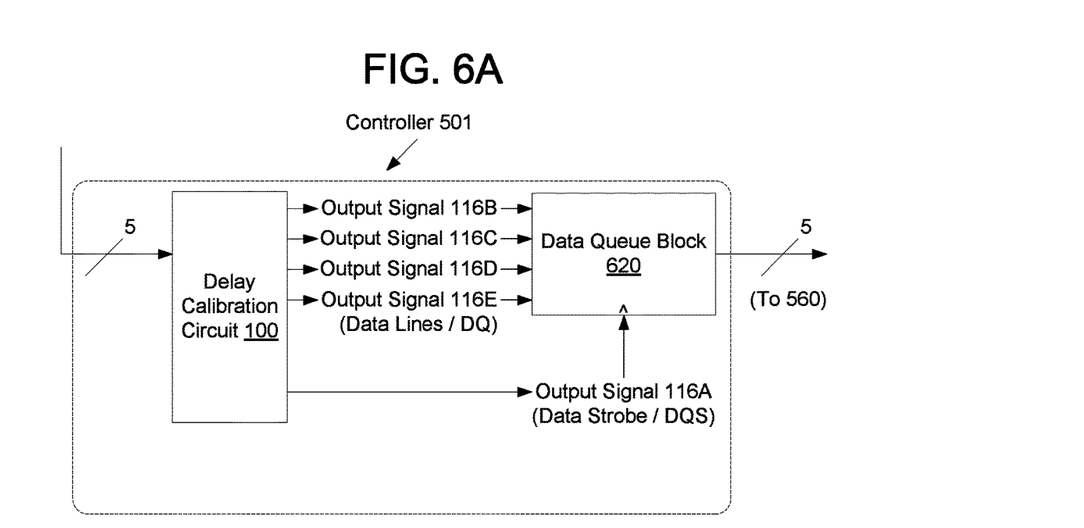
FIG. 6A is a block diagram illustrating the controller of FIG. 5 using direct measurement delay calibration to write data onto the data bus of FIG. 5.

FIG. 6A is a block diagram illustrating controller 501 of FIG. 5 using direct measurement delay calibration to write data to flash memory 503 via data bus 560 of FIG. 5. As shown in FIG. 6A, controller 501 receives a 5 bit wide input signal from storage medium 502 or from another location, for example via a serial or parallel connection to storage medium 502, interface 505, or an internal component of controller 501. For example, controller 501 may receive a write request from host 504 with a payload that is stored in a buffer of storage medium 502 or in another location. If the connection between controller 501 and storage medium 502 (or another location) is a serial connection, then the data may be serialized and deserialized.

Delay calibration circuit 100 generates output signal 116A corresponding to the data strobe (DQS) and output signals 116B-116E corresponding to the data lines (DQ) as described above in conjunction with process 400 of FIG. 4. These output signals 116A-116E are sent to a data queue block 620, which uses the output signal 116A as the clock for outputting data onto data bus 560.

Figure 6B:
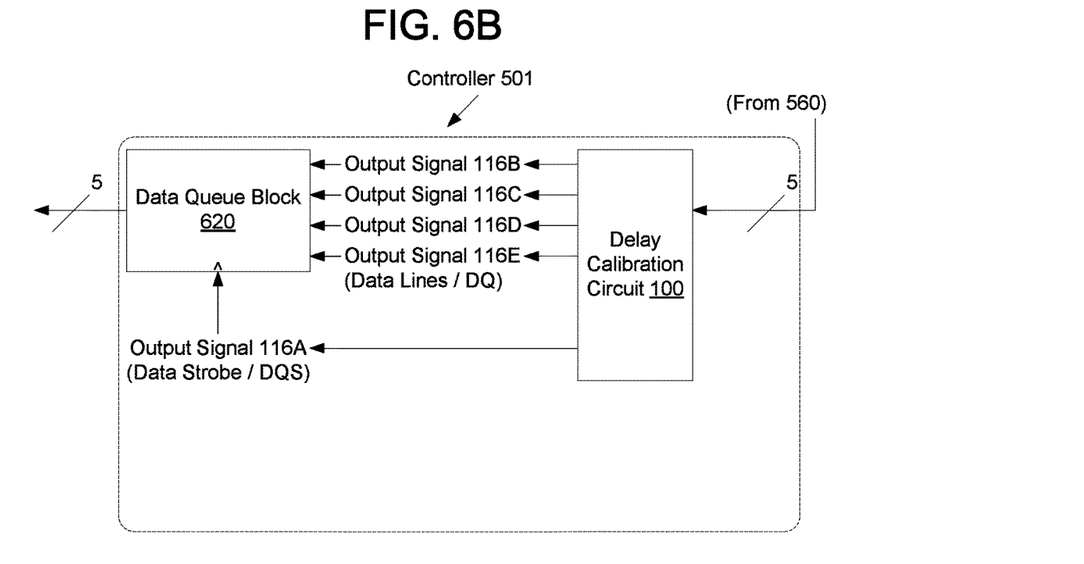
FIG. 6B is a block diagram illustrating the controller of FIG. 5 using direct measurement delay calibration to read data from the data bus of FIG. 5.

Since data bus 560 may be bidirectional, controller 501 may also read from data bus 560 (e.g., data received from flash memory 503). FIG. 6B is a block diagram illustrating controller 501 of FIG. 5 using direct measurement delay calibration to read data from data bus 560 of FIG. 5. As shown in FIG. 6B, controller 501 receives a 5 bit wide input signal (one of which may be a data strobe) from data bus 560.

Delay calibration circuit 100 generates output signal 116A corresponding to the data strobe (DQS) and output signals 116B-116E corresponding to the data lines (DQ) as described above in conjunction with process 400 of FIG. 4. These output signals 116A-116E are sent to a data queue block 620, which uses the output signal 116A as the clock for outputting data. As discussed above, the signals may also be serialized and deserialized. The data may be transferred to host 504 either after being stored in a buffer in a storage medium 502 or another location, or the data may be transferred to host 504 without being stored.

One or more implementations of the subject technology provide apparatuses for providing direct measurement delay calibration. According to some aspects, an apparatus may include a plurality of delay elements in a loop. The apparatus may also include a controller coupled to the plurality of delay elements. The controller may be configured to cause determining, for a predetermined time period, delay oscillations from the plurality of delay elements in the loop. The controller may also be configured to cause determining, based on the determined delay oscillations, the predetermined time period, and a quantity of the plurality of delay elements, a subset of the plurality of delay elements for delaying an input signal. The controller may also be configured to cause routing the input signal through the subset of the plurality of delay elements.

One or more aspects of the subject technology provide methods for direct measurement delay calibration. According to some aspects, a method may include determining, for a predetermined time period, delay oscillations from a plurality of delay elements in a loop. The method may also include determining a delay time of a delay element of the plurality of delay elements based on the determined delay oscillations, the predetermined time period, and a quantity of the plurality of delay elements. The method may also include determining, based on the delay time, a subset of the plurality of delay elements for delaying an input signal. The method may also include routing the input signal through the subset of the plurality of delay elements.

In other aspects, an apparatus may include a plurality of delay elements having an input and an output. The apparatus may include a first inverter coupled to the output of the plurality of delay elements and coupled to the input of the plurality of delay elements. The apparatus may include a controller coupled to the plurality of delay elements and the first inverter. The controller may be configured to cause determining, for a predetermined time period, delay oscillations from the plurality of delay elements and the first inverter. The controller may also be configured to cause determining, based on the determined delay oscillations, the predetermined time period, and a quantity of the plurality of delay elements, a subset of the plurality of delay elements for delaying an input signal. The controller may also be configured to cause routing the input signal through the subset of the plurality of delay elements.

In further aspects, non-transitory machine-readable media including machine-executable instructions may be provided that, when executed by a processor, perform methods. A method may include determining, for a predetermined time period, delay oscillations from a plurality of delay elements in a loop. The method may include determining a delay time of a delay element of the plurality of delay elements based on the determined delay oscillations, the predetermined time period, and a quantity of the plurality of delay elements. The method may include determining, based on the delay time, a subset of the plurality of delay elements for delaying an input signal. The method may include causing the input signal to be routed through the subset of the plurality of delay elements.

In further aspects, an apparatus may include means for determining, for a predetermined time period, delay oscillations from a plurality of delay elements in a loop. The apparatus may also include means for determining a delay time of a delay element of the plurality of delay elements based on the determined delay oscillations, the predetermined time period, and a quantity of the plurality of delay elements. The apparatus may also include means for determining, based on the delay time, a subset of the plurality of delay elements for delaying an input signal. The apparatus may also include means for routing the input signal through the subset of the plurality of delay elements.

It is understood that other configurations of the subject technology will become readily apparent to those skilled in the art from the detailed description herein, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus, comprising:
    a plurality of delay elements in a loop; and
    a controller coupled to the plurality of delay elements, wherein the controller is configured to cause:
        determining, for a predetermined time period, delay oscillations from the plurality of delay elements in the loop;
        determining, based on the determined delay oscillations, the predetermined time period, and a quantity of the plurality of delay elements, a subset of the plurality of delay elements for delaying an input signal; and
        routing the input signal through the subset of the plurality of delay elements.

2. The apparatus of claim 1, wherein the controller is configured to cause determining the subset of the plurality of delay elements based on a predetermined delay setting for the input signal.

3. The apparatus of claim 1, wherein the input signal is one of a plurality of input signals, and wherein the controller is configured to cause routing each of the plurality of input signals through independent subsets of the plurality of delay elements.

4. The apparatus of claim 1, wherein the plurality of delay elements include a first maximum number of delay elements allocated for a clock signal and a second maximum number of delay elements allocated for each of one or more data signals, wherein the first maximum number is greater than the second maximum number.

5. The apparatus of claim 1, wherein the loop comprises a ring oscillator.

6. The apparatus of claim 1, wherein the controller is configured to cause the determining the subset of the plurality of delay elements by:
    determining a delay time of a delay element of the plurality of delay elements based on the determined delay oscillations, the predetermined time period, and the quantity of the plurality of delay elements; and
    determining, based on the delay time, the subset of the plurality of delay elements for delaying the input signal.

7. The apparatus of claim 6, wherein the controller is configured to repeat the determining of the delay time of the delay element when a data bus coupled to the controller is idle.

8. The apparatus of claim 1, wherein the quantity of the plurality of delay elements is based on a predetermined adjustment range for the input signal.

9. The apparatus of claim 1, wherein the predetermined time period is based on meeting an accuracy threshold for delaying the input signal according to a predetermined delay setting for the input signal.

10. The apparatus of claim 1, wherein the controller is coupled to a data bus that is coupled to one or more memory devices.

11. A method, comprising:
    determining, for a predetermined time period, delay oscillations from a plurality of delay elements in a loop;
    determining a delay time of a delay element of the plurality of delay elements based on the determined delay oscillations, the predetermined time period, and a quantity of the plurality of delay elements;
    determining, based on the delay time, a subset of the plurality of delay elements for delaying an input signal; and
    routing the input signal through the subset of the plurality of delay elements.

12. The method of claim 11, wherein determining the subset of the plurality of delay elements is based on a predetermined delay setting for the input signal.

13. The method of claim 11, wherein the input signal is one of a plurality of input signals, wherein the method comprises routing each of the plurality of input signals through independent subsets of the plurality of delay elements, and wherein routing each of the plurality of input signals comprises routing the input signal.

14. The method of claim 11, wherein the plurality of delay elements include a first maximum number of delay elements allocated for a clock signal and a second maximum number of delay elements allocated for each of one or more data signals, wherein the first maximum number is greater than the second maximum number.

15. An apparatus, comprising:
a plurality of delay elements having an input and an output;
a first inverter coupled to the output of the plurality of delay elements and coupled to the input of the plurality of delay elements; and
a controller coupled to the plurality of delay elements and the first inverter,
wherein the controller is configured to cause:
    determining, for a predetermined time period, delay oscillations from the plurality of delay elements and the first inverter;
    determining, based on the determined delay oscillations, the predetermined time period, and a quantity of the plurality of delay elements, a subset of the plurality of delay elements for delaying an input signal; and
    routing the input signal through the subset of the plurality of delay elements.

16. The apparatus of claim 15, wherein the controller comprises a counter for counting the delay oscillations.

17. The apparatus of claim 16, wherein the controller comprises a second controller configured to cause determining the subset of the plurality of delay elements based on a predetermined delay setting for the input signal.

18. The apparatus of claim 17, further comprising a second inverter coupled to the first inverter, wherein the second controller and the second inverter are coupled to a logic gate for outputting a counter clock to the counter.

19. A non-transitory machine-readable medium including machine-executable instructions thereon that, when executed by a processor, perform a method comprising:
determining, for a predetermined time period, delay oscillations from a plurality of delay elements in a loop;
determining a delay time of a delay element of the plurality of delay elements based on the determined delay oscillations, the predetermined time period, and a quantity of the plurality of delay elements;
determining, based on the delay time, a subset of the plurality of delay elements for delaying an input signal; and
causing the input signal to be routed through the subset of the plurality of delay elements.

20. An apparatus, comprising:
means for determining, for a predetermined time period, delay oscillations from a plurality of delay elements in a loop;
means for determining a delay time of a delay element of the plurality of delay elements based on the determined delay oscillations, the predetermined time period, and a quantity of the plurality of delay elements;
means for determining, based on the delay time, a subset of the plurality of delay elements for delaying an input signal; and
means for routing the input signal through the subset of the plurality of delay elements.

\* \* \* \* \*